(12) United States Patent
Volkov et al.

(10) Patent No.: US 9,853,631 B2
(45) Date of Patent: Dec. 26, 2017

(54) HIGH POWER PULSE GENERATOR HAVING A SUBSTANTIALLY QUADRANGULAR SHAPE WITH AN ADJUSTABLE SLOPE

(71) Applicant: I T H P P, Thegra (FR)

(72) Inventors: Sergey Volkov, Tomsk (RU); Vitaly Alexeenko, Tomsk (RU); Sergey Kondratiev, Tomsk (RU); Frederic Bayol, Themines (FR); Gauthier Demol, Saint Cere (FR)

(73) Assignee: I T H P P, Thegra (FR)

( * ) Notice: Subject to any disclaimer, the term of this patent is extended or adjusted under 35 U.S.C. 154(b) by 509 days.

(21) Appl. No.: 14/427,740

(22) PCT Filed: Aug. 30, 2013

(86) PCT No.: PCT/FR2013/052003
§ 371 (c)(1),
(2) Date: Mar. 12, 2015

(87) PCT Pub. No.: WO2014/041276
PCT Pub. Date: Mar. 20, 2014

(65) Prior Publication Data
US 2015/0270831 A1 Sep. 24, 2015

(30) Foreign Application Priority Data
Sep. 14, 2012 (FR) ...................................... 12 58662

(51) Int. Cl.
*H03K 3/00* (2006.01)
*H03K 3/64* (2006.01)
*H03K 3/53* (2006.01)

(52) U.S. Cl.
CPC ...................................... *H03K 3/53* (2013.01)

(58) Field of Classification Search
CPC ........................................................ H03K 3/53
(Continued)

(56) References Cited

U.S. PATENT DOCUMENTS 5,452,222 A * 9/1995 Gray .................... G01R 31/001
376/156
6,211,683 B1 4/2001 Wolf
(Continued)

FOREIGN PATENT DOCUMENTS

| DE | 196 39 023 A1 | 3/1996 |
| DE | 10 2006 033374 A1 | 1/2008 |
| FR | 2 879 842 A1 | 6/2006 |

OTHER PUBLICATIONS

A. A. Kim et al.: "Square pulse linear transformer driver", Physical Review Special Topics—Accelerators and Beams 15, 040401 (2012), (Received Dec. 13, 2011; published Apr. 3, 2012), Published by the American Physical Society.
(Continued)

*Primary Examiner* — Rexford Barnie
*Assistant Examiner* — Toan Vu
(74) *Attorney, Agent, or Firm* — Young & Thompson

(57) ABSTRACT

A high-power pulse generator (1), belonging to the LTD family, includes two series of power modules, one series of standard modules (3s) and one series of modified modules (3m), each including a switch (6s; 6m), provided with a trigger electrode (9s; 9m), positioned in series between two capacitors (4s; 4m), the modified modules being designed to produce a pulse at a frequency substantially three times the frequency of the standard modules, and a trigger device (13) designed to control the standard and modified switches (6s; 6m) via a single trigger signal applied to the trigger electrode (9s; 9m) of same. The trigger signal is applied to the switches through a trigger impedance (10m; 10s) that is different between the standard and modified modules, and
(Continued)

the plateau slope of the generated pulse depends on the difference between the value of the standard impedance and that of the modified impedance.

15 Claims, 3 Drawing Sheets

(58) Field of Classification Search
USPC .......................................................... 307/108
See application file for complete search history.

(56) References Cited

U.S. PATENT DOCUMENTS

| | | |
|---|---|---|
| 2007/0296342 A1 | 12/2007 | Mayes |
| 2008/0106840 A1 | 5/2008 | Frescaline |
| 2008/0191559 A1* | 8/2008 | Staines ............... F41H 13/0068 307/108 |

OTHER PUBLICATIONS

International Search Report, dated Oct. 24, 2013, from corresponding PCT application.

* cited by examiner

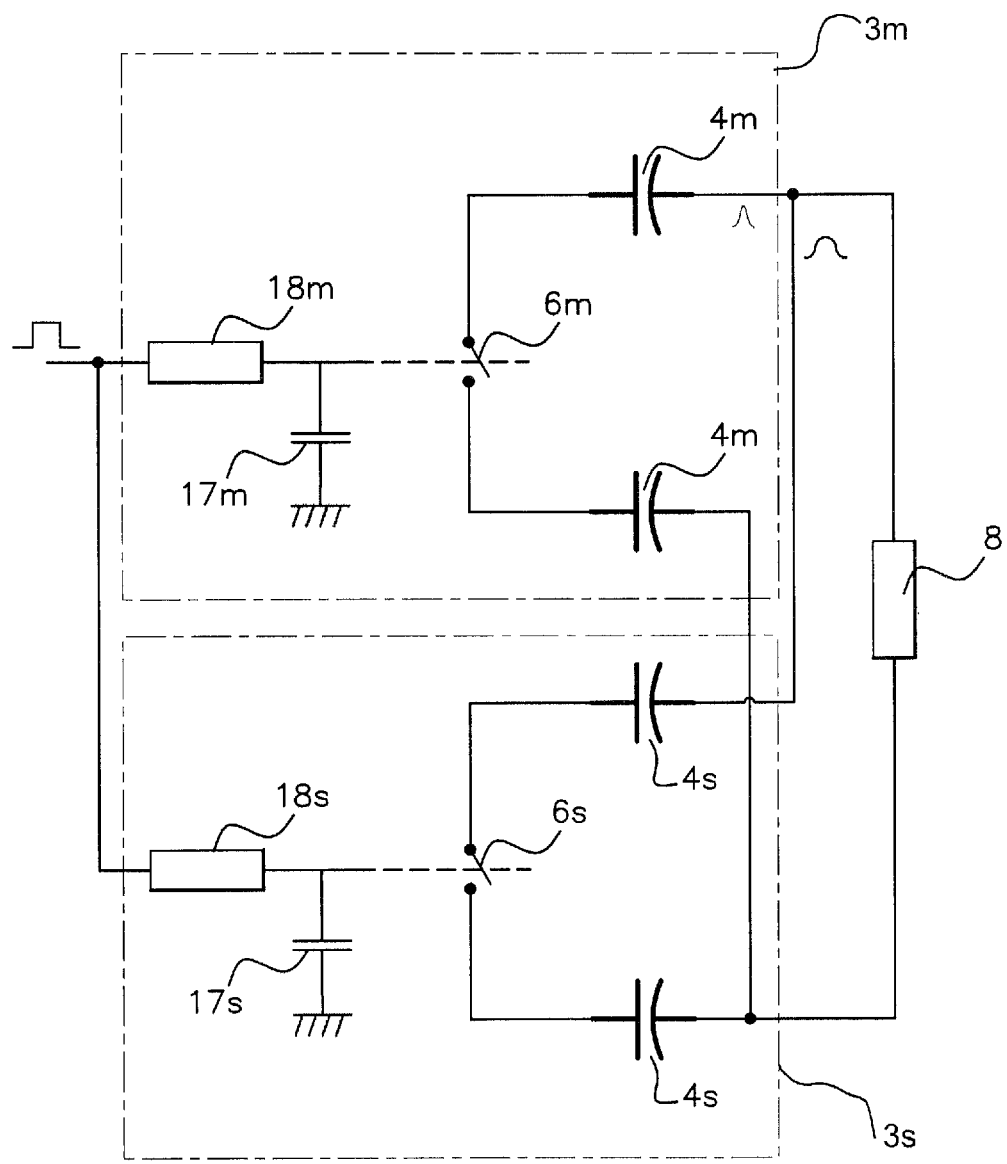

HIGH POWER PULSE GENERATOR HAVING A SUBSTANTIALLY QUADRANGULAR SHAPE WITH AN ADJUSTABLE SLOPE

The invention relates to a high-power pulse generator of the LTD (Linear Transformer Driver) family and, more specifically, to such a generator that is capable of providing pulses of quadrangular shape with an adjustable slope in the upper part of the pulse.

The technical field of "high pulsed power" uses generators capable of providing extremely brief pulses with a voltage of several million volts and an intensity of several million amperes. For example, generators are known, called Marx generators, in which capacitors are charged in parallel and discharged in series by means of controlled spark gaps, called switches. Such switches are known, for example, from the French patent FR 2879842 of the Applicant, which can be referred to for further information relating to the switch.

More recently, generators of the Linear Transformer Driver (LTD) type have been used, which generators are made up of a plurality of modules each comprising a switch positioned in series between two capacitors, with the capacitors being charged in parallel and discharged in series when the switch is closed, with the current pulse thus generated being added to the current pulses of all of the other modules in order to form a high-power pulse. However, these pulses are generally of quasi-sinusoidal shape and, for certain applications, the need arose to have pulses of substantially rectangular or trapezoidal shape.

According to the publication, "*Square pulse linear transformer driver*", by KIM, MAZARAKIS et al., published on 3 Apr. 2012 in the review entitled "Physical Review Special Topics—Accelerators and Beams No. 15", a generator of the LTD type is known that comprises two series of power modules, a first series of standard modules comprising a pair of capacitors with a first capacitance value designed to produce a pulse with a first frequency and a second series of modified modules comprising a pair of capacitors with a second capacitance value designed to produce a frequency pulse that is three times the first frequency when the switch is closed. Combining these two pulses in a load provides, by applying the Fourier theorem, a substantially rectangular resulting pulse, comprising a rising slope, a plateau and a falling slope. However, the authors have suggested that such a pulse comprising a plateau with a rising or falling slope could be best suited to certain applications such as hydrogen fusion (z-pinch machines), flash radiography (intense x-rays) or even high-power microwaves.

This publication suggests that the slope of the plateau could be adjusted by modifying the inductance of the modified modules, for example by modifying the width of the conductors connecting the capacitors to the load. However, such a solution has disadvantages: increasing the width of the conductors, which reduces the inductance of the module, is limited due to the spatial requirement and the isolation between the conductors. Similarly, reducing the width of the conductors adversely affects the performance of the generator by reducing the maximum permissible power and by increasing the width of the pulses due to the increase in the inductance.

Therefore, the object of the invention is a generator of the LTD type designed to deliver high-power and quadrangular shaped pulses, wherein the slope of the pulse plateau can be adjusted without having the disadvantages of the prior art.

The aim of the invention is such a generator that is capable of maintaining optimal output performance, particularly output power.

A further aim of the invention is such a generator, wherein the shape of the pulse can be adjusted without modifying and, in particular, without increasing the inductance of the generator.

A further aim of the invention is such a generator, wherein it is easy to adjust the slope of the plateau of the pulse without requiring any machining or modification of the parts of the generator.

A further aim of the invention is such a generator that can be adjusted at the end of construction, whilst retaining a maximum number of standard parts.

To this end, the invention relates to a high-power pulse generator comprising:

a first series of power modules, called standard modules, each comprising a switch, called standard switch, provided with a trigger electrode, positioned in series with at least one capacitor with a first capacitance value, said standard modules being designed to produce a pulse with a first frequency when the switch is closed;

a second series of power modules, called modified modules, each comprising a switch, called modified switch, provided with a trigger electrode, positioned in series with at least one capacitor with a second capacitance value, said modified modules being designed to produce a pulse with a second frequency when the switch is closed, said second frequency being substantially three times that of the first frequency;

a central core comprising a magnetic core that comprises at least one ferromagnetic ring, designed to add the pulses produced by the standard and modified modules in a load concentric to said ring(s) and to obtain a substantially quadrangular resulting pulse comprising a rising edge, a plateau and a falling edge;

a trigger device designed to control the standard and modified switches with a trigger signal applied to their trigger electrode, said generator being characterised in that said trigger signal is applied through a trigger impedance connected to the trigger electrode of the switch, with the trigger impedance of the modified switches, called modified impedance, being distinct from the trigger impedance of the standard switches, called standard impedance, and in that a slope of the pulse plateau depends on the difference between the value of the standard impedance and that of the modified impedance.

Whilst seeking to resolve an altogether different problem, namely the jitter of the trigger time of the switches, the inventors observed that, surprisingly, modifying the trigger impedance of the modified switches influenced the slope of the pulse plateau. The inventors then observed that the influencing parameter was the difference between the values of the trigger impedances of the modified switches and of the standard switches. By virtue of this unexpected technical effect, it is now possible for a pulse generator to be produced that can provide high-power quadrangular pulses with an adjustable slope, without having to modify the structure of the power modules. Simply changing an impedance thus allows the pulse generator to be adapted as a function of the contemplated use, for example a rising plateau pulse generator for a z-pinch machine Advantageously and according to the invention, the trigger impedances of the standard and modified switches each comprise at least one trigger resistance, respectively called standard resistance and modified resistance. Thus, the trigger impedance of a module (standard or modified) is basically made up of a pure resistance, but can also comprise an inductance in series, with the standard and modified resistances having different values for identical or different inductance values and vice-versa. In practice however, the trigger impedance is a resistance.

Advantageously and according to the invention, a difference above a determined threshold between the standard resistance and the modified resistance determines a rising slope of the pulse plateau. The threshold depends on numerous parameters such as the structure of the generator (number of modified modules/number of standard modules), the type and the size of the switches used and the current that passes through said switches. In this case, the current passing through the switches of the modified modules is weaker (as a result of capacitors with lower capacitance) than that which passes through the standard switches. The threshold of the difference between the standard and modified resistances is determined by the value of the difference that allows a substantially horizontal pulse plateau to be obtained. Similarly, a difference below this determined threshold between the standard resistance and the modified resistance determines a falling slope of the pulse plateau.

It is also possible for different switches to be used between the standard and modified modules. By using switches that are adapted to the current passing through the respective modules, the determined threshold is generally zero and a modified resistance below the standard resistance allows a rising slope to be obtained for the pulse plateau.

Thus, in a pulse generator of the prior art comprising, for example, six standard modules for two modified modules, changing two resistances is sufficient for determining the shape of the output pulses.

Advantageously and according to the invention, the trigger resistors are formed from agglomerated carbon bars. Using solid resistors, made of agglomerated carbon, allows good precision to be obtained for the resistance values at a moderate cost. Of course, other types of resistors that are currently used in this type of generator can also be used, such as liquid resistors formed from tubes filled with an electrolytic solution such as potassium bromide or copper sulphate or even resistors formed from a cylinder of elastomer material loaded with carbon particles. For these resistors, whether they are liquid or elastomer, the length, the cross-section and the resistivity of the material determine the value of the resistance.

Advantageously and according to the invention, the slope of the pulse plateau also depends on a difference in the parasitic input capacitances of the standard and modified switches at the moment they are closed. It has also been noted that the parasitic capacitance of the trigger electrode, i.e. the capacitance between the trigger electrode and ground, could to a lesser extent influence the slope of the pulse plateau. In effect, in order to close the switches, the trigger signal must charge this capacitance until a disruptive voltage is reached between the trigger electrode and one of the electrodes of the switch. As this charge occurs through the trigger resistance, the value of this capacitance, and that of the trigger resistance, determines a delay between the application of the trigger signal and the closure of the switch.

Advantageously and according to the invention, the input capacitance of the standard and modified switches depends on their diameter. In effect, it has been noted that the input capacitance of a switch increased with the diameter of said switch at equal operating voltage. It is therefore possible for the slope of the plateau of the generated pulse to be influenced by changing the diameter of the standard switches or of the modified switches.

Advantageously and according to the invention, the slope of the pulse plateau depends on a difference, between the standard and modified modules, in a delay between the trigger signal and the establishment of a pulse current between the terminals of the switch. To this end, the trigger impedance of the standard modules and/or of the modified modules can be modified overall from the output of the trigger device so as to distribute, to each series of modules, a trigger signal with a time lag between the standard modules and the modified modules.

Further means, such as, for example, sorting and pairing switches in standard or modified modules as a function of this trigger delay allow a generator to be produced that is designed to provide pulses with a predetermined plateau slope. Thus, regardless of the cause of this trigger delay, if the switches of the modified modules are faster than those of the standard modules, the slope of the pulse plateau is rising and vice-versa.

The invention further relates to a high-power pulse generator, characterised, in combination, by all or part of the features mentioned above or hereafter.

Further objects, features and advantages of the invention will become apparent upon reading the following description and with reference to the appended drawings, wherein:

FIG. 1 schematically shows a top view, with the cover removed, of a generator according to the invention;

FIG. 5 is a drawing explaining the operation of a switch belonging to a generator according to the invention.

Figure 1:
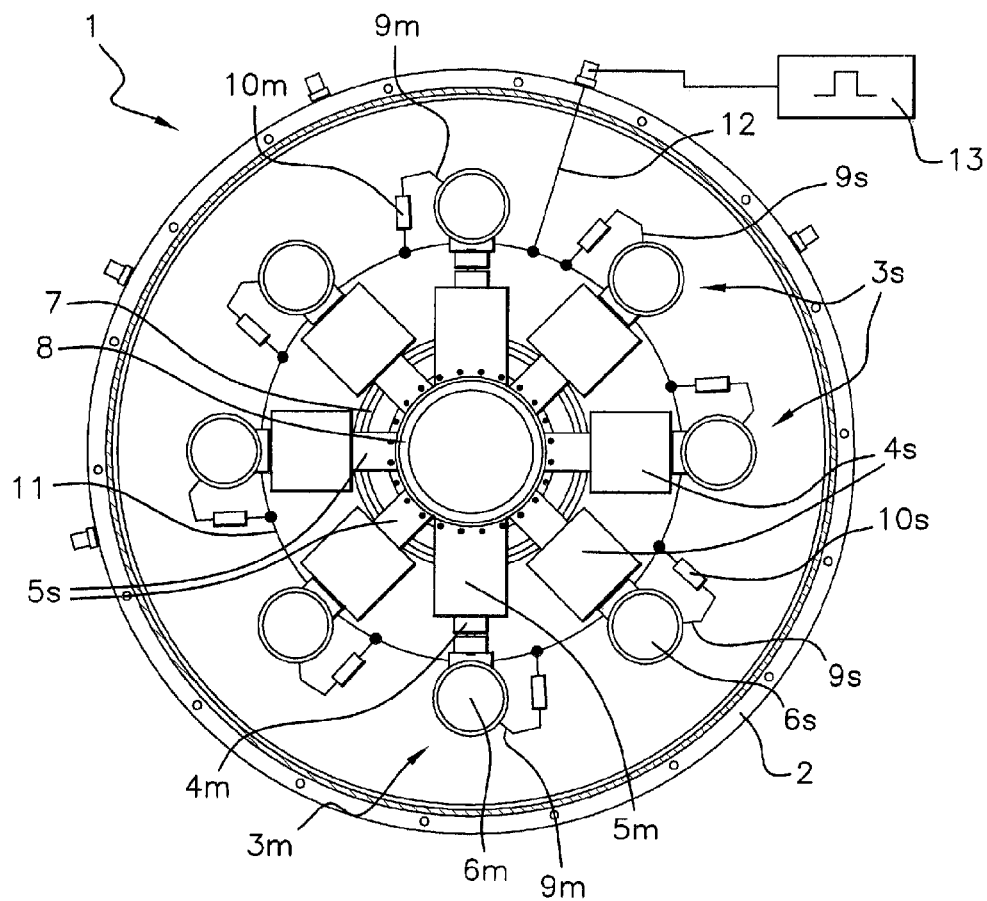

The generator 1 shown in FIG. 1 comprises a cavity 2, inside of which two series of power modules are arranged in a symmetric and equally distributed manner. The generator 1 comprises a first series of six power modules, called standard modules, each of which is universally identified with the reference numeral 3s, and a second series of power modules, called modified modules, each of which is universally identified with the reference numeral 3m.

Throughout this document, the standard modules and their elements are distinguished from the modified modules and their elements by assigning reference numerals that designate the standard modules with the designation s and the modified modules with the designation m. Therefore, the standard power modules use reference numeral 3s and the modified power modules use reference numeral 3m. When the reference numeral of a module or of an element is not specified with an s or m designation, it applies equally to the standard modules or to the modified modules. Similarly, in order to simplify the text, an element belonging to a modified module can be called "modified element" without necessarily meaning that it differs from the corresponding element belonging to a standard module, itself called standard element.

In the drawing of FIG. 1, the power modules are disposed in a star-shaped manner about a central core, the modified modules 3m occupy the positions at 12 o'clock and at 6 o'clock and the standard modules 3s are distributed on both sides of the modified modules at a 45° angle to each other.

Figure 2:
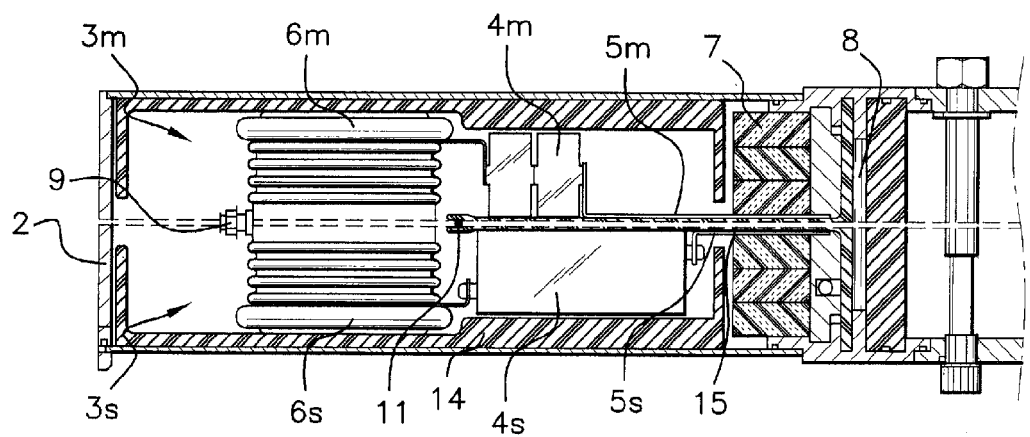
FIG. 2 is a cross-section view of a power module of a generator according to the invention.

Each module, a cross-section of which is shown in FIG. 2 along a radial plane of the generator of FIG. 1, with the cross-section showing a modified module 3m in the upper part and a standard module 3s in the lower part, comprises a switch 6 (6m for the switch of the modified module and 6s for the switch of the standard module, respectively). Each switch comprises a pressurised isolating casing, a discharge electrode at each end of the casing and a plurality of intermediate electrodes, one of which is a trigger electrode 9 (9m for the switch of the modified module and 9s for the switch of the standard module, respectively). Each module comprises two capacitors 4 (4m for the modified capacitor and 4s for the standard capacitor, respectively) positioned in series on both sides of the switch 6 and connected via one of their electrodes to the corresponding discharge electrode of the switch. In the example shown, the standard module 3s comprises two capacitors 4s with a capacitance of 8 nF at an operating voltage of 100 kV (only one of which is shown in the lower part of FIG. 2) separated by an isolating plate 15. Similarly, the modified module 3m comprises two capacitors 4m, each made up of two capacitors in series with a value of 1.7 nF at an operating voltage of 50 kV. Each capacitor 4s (4m, respectively) is connected, at the opposite side of the switch, to a conductor 5s (5m, respectively) in the form of a substantially rectangular metal plate, pressed against the isolating plate 15 and extending toward the centre of the cavity 2. The conductors 5 thus pass through a central core 7 made up of a plurality of rings made of ferromagnetic material and form an interface with a load 8 made up of a ring filled with an electrolytic solution such as potassium bromide.

The isolating plate 15 comprises, on its outer periphery, a conducting ring, called trigger ring 11, allowing the distribution of a trigger signal coming from a trigger device 13 connected to the trigger ring 11 by a trigger line 12.

The trigger electrodes 9m and 9s of the modified modules 3m and the standard modules 3s, respectively, are connected to the trigger ring 11 through trigger impedances 10m and 10s, respectively. These trigger impedances are made up of at least one resistor 18, preferably a solid resistor made of agglomerated carbon, associated with an inductance where necessary. In the particular case of the generator described herein, the trigger impedances are made up of a pure resistance, called standard resistance 18s for the standard modules and modified resistance 18m for the modified modules.

The standard and modified modules, as well as their trigger resistor, are contained in two half-shells 14 made of the same material as the isolating plate 15 and are immersed in an isolating oil.

Figure 3:
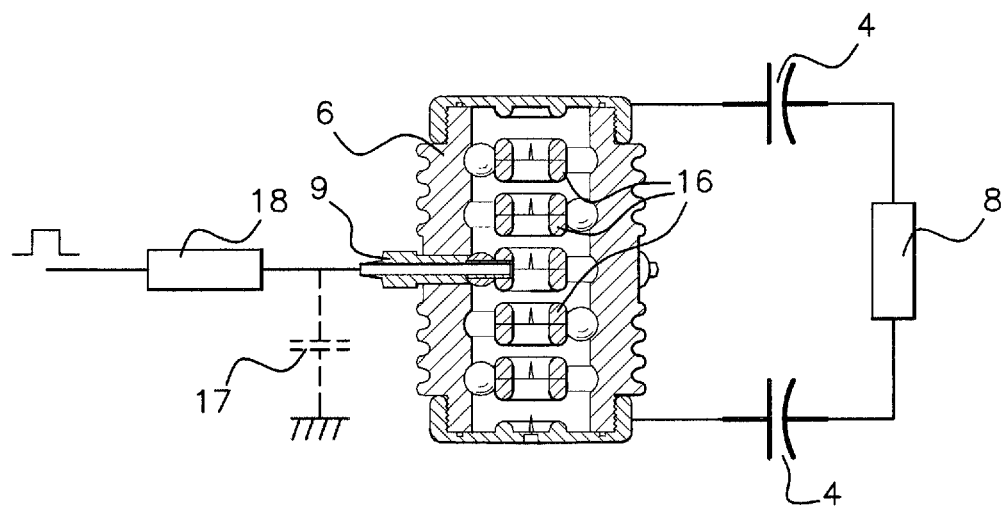
FIG. 3 is an electrical diagram drawing of the trigger device of a generator according to the invention.

The operation of one of the modules of the generator according to the invention is described hereafter with reference to FIG. 3.

The capacitors 4 are charged in parallel by a voltage of +100 kV for one and of −100 kV for the other, respectively, thus establishing a potential difference of 200 kV at the terminals of the switches 6. A trigger signal transmitted by the trigger device 13 is transmitted through the trigger ring 11 to the trigger resistor 10 and the trigger electrode 9. The trigger signal, generally in the form of a pulse of several tens of kilovolts, causes a modification to the distribution of the potentials inside the switch 6 and causes the closure thereof. As soon as the switch 6 is closed, a current is established through the switch and the energy stored in the capacitors 4 generates a current circulating in the load 8.

However, it has been noted that a delay occurred between the trigger signal and the establishment of the current in the switch, and that this occurred both in the standard modules and in the modified modules. Furthermore, the duration of this delay suffers from a random variation (jitter) of a few nanoseconds. It was whilst seeking a solution to this phenomenon that the inventors observed, by using different values of trigger resistance on the modified modules, that the pulse plateau of the resulting pulse provided by the generator had a variable slope.

The subsequent analysis of this phenomenon drew the following conclusion: the switch 6 behaves as if a "parasitic" trigger capacitance 17 exists between the trigger electrode 9 and ground. Of course, the capacitance 17 shown on the drawing of FIGS. 3 and 5 is only a practical representation, with the actual parasitic capacitance being distributed between the trigger electrode and the two terminals of the switch 6 and between said terminals and ground. The trigger resistance 10 and capacitance 17 set then generates a time constant causing a delay between the application of the trigger signal and the actual closure of the switch 6.

Figure 4:
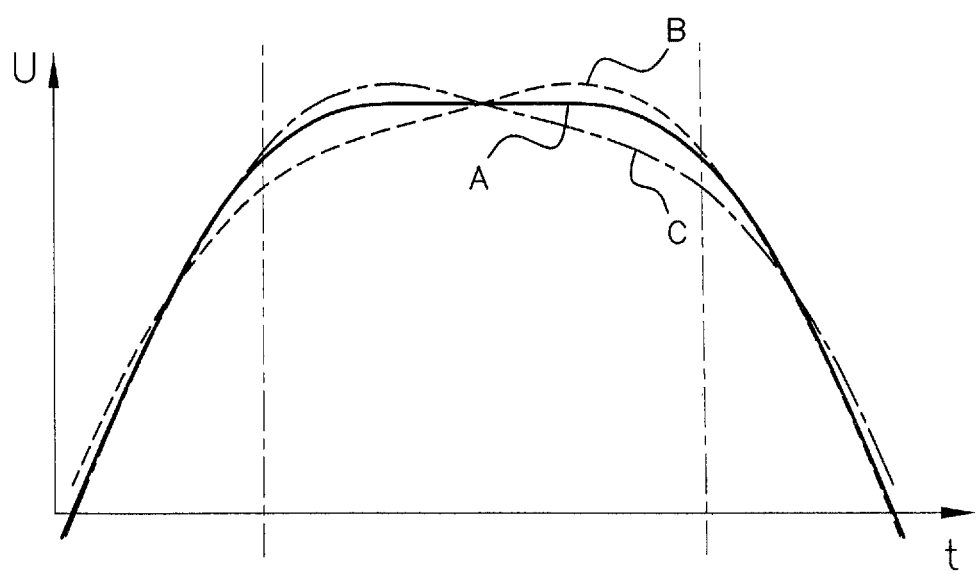
FIG. 4 is a drawing showing the various pulse shapes likely to be obtained with a generator according to the invention.

Furthermore, when this delay affects, in the same direction (delay or advance), the modified switches 6m relative to the standard switches 6s, the pulse generated by the modified switches has a phase shift relative to that generated by the standard switches. This phase shift causes a slope on the pulse plateau, as shown in FIG. 4. In this figure, the solid line, reference numeral A, shows the shape of the pulse obtained by a generator in which the trigger delay of the standard modules is equal to the trigger delay of the modified modules. It can be seen that the plateau of this pulse (between the two vertical reference lines) is substantially horizontal. Similarly, the shape of a pulse obtained when the trigger delay of the standard modules is higher than that of the modified modules (ascending slope) is shown with the dashed line, reference numeral B, and the shape of a pulse obtained when the trigger delay of the modified modules is higher than that of the standard modules is shown by the mixed-dash line, reference numeral C.

The schematic representation of the generator according to the invention shown in FIG. 5 allows the operation of the generator to be better understood. In this figure, reference numeral 3m represents a modified module that represents the sum of the modified modules of the generator and reference numeral 3s represents a standard module that represents the sum of the standard modules of the generator.

When the trigger signal is delivered to the standard module 3s, the trigger resistance 18s and the parasitic input capacitance 17s of the module form an RC circuit designed to cause a delay in the closure of the switch 6s, which delay depends on the product of the value of the trigger resistance and of the parasitic input capacitance. When the switch 6s closes, the capacitors 4s discharge through the switch in the load 8, forming a first pulse with a first frequency that depends on the value of the capacitors 4s.

The operation is identical for the modified module 3m. The switch 6m closes with a delay that depends on the trigger resistance 18m and on the parasitic capacitance 17m and causes a second pulse to be generated with a second frequency that depends on the value of the capacitors 4m. This is provided so that the second frequency is three times that of the first frequency.

The two pulses are combined in the load 8 so as to generate a resulting quadrangular pulse. The difference in closure delay of the modified and standard modules causes these pulses to be phase-shifted one relative to the other and, by applying the Fourier theorem, determines the slope of the plateau of the resulting pulse.

However, it has been noted that the value of the capacitances 17m and 17s is very low, of the order of 15 pF, and that it is difficult to vary this capacitance, other than by varying the diameter of the switches. It is therefore possible to influence the value of these capacitances by using switches with different diameters between the standard modules and the modified modules. However, this variation is limited by spatial requirement constraints, with the increase in the diameter of a switch resulting in the increase in the diameter of the whole generator in order to maintain an isolation distance between the switches.

It is therefore preferable for the value of the trigger resistances to be modified in order to obtain the desired slope for the pulse plateau. By way of example, for standard switches 6s with a 140 mm diameter and modified switches 6m with a 78 mm diameter, and for a trigger resistance 18s of 500 ohms for the standard modules, the use of a trigger resistance 18m of 330 ohms for the modified modules results in a rising slope of the pulse plateau, a trigger resistance 18m of 540 ohms provides a substantially horizontal slope and a trigger resistance 18m of 1,000 ohms provides a falling slope. By using modified switches 6m that are identical to the standard switches 6s, i.e. with a 140 mm diameter, standard trigger resistances of 540 ohms and modified resistances of 330 ohms result in a substantially horizontal slope.

Of course, the aforementioned description, which describes the invention in relation to a particular LTD generator, is provided solely by way of illustration and a person skilled in the art could apply numerous modifications thereto without departing from the scope of the invention, such as, for example, applying the invention to different generator geometries, comprising a different number of modules per cavity (for example, 40 modules per cavity), a different ratio between the number of modified and standard modules or even a generator made up of a plurality of cavities in series. Similarly, the power modules can be double-polarity (±100 KV with the switch in series between the capacitors, as in the example shown) or even single-polarity with a single capacitor in series with the switch, fed by one or more different voltages (50 KV), etc. The modules can be isolated by an oil bath, as in the example shown, or even by a gas such as pressurised dry air or other.

The invention claimed is:
1. High-power pulse generator (1) comprising:
a first series of power modules, called standard modules (3s), each comprising a switch, called standard switch (6s), provided with a trigger electrode (9s), positioned in series with at least one capacitor (4s) with a first capacitance value, said standard modules being designed to produce a pulse at a first frequency when said switch is closed;
a second series of power modules, called modified modules (3m), each comprising a switch, called modified switch (6m), provided with a trigger electrode (9m), positioned in series with at least one capacitor (4m) with a second capacitance value, said modified modules being designed to produce a pulse at a second frequency when said switch is closed, said second frequency being substantially three times that of the first frequency;
a central core comprising a magnetic core that comprises at least one ferromagnetic ring (7) designed to add the pulses produced by said standard (3s) and modified (3m) modules in a load (8) concentric to said ring(s) and to obtain a substantially quadrangular shaped resulting pulse comprising a rising edge, a plateau and a falling edge;
a trigger device (13) designed to control said standard and modified switches (6s; 6m) by a trigger signal applied to their trigger electrode (9s; 9m),
said generator (1) being characterised in that said trigger signal is applied to said switches through a trigger impedance (10m; 10s) connected to the trigger electrode of the switch, with the trigger impedance of said modified switches, called modified impedance (10m), being distinct from the trigger impedance of said standard switches, called standard impedance (10s), and in that a slope of the pulse plateau depends on the difference between the value of said standard impedance and that of said modified impedance.

2. Generator as claimed in claim 1, wherein said trigger impedances (10s; 10m) of said standard (6s) and modified (6m) switches each comprise at least one trigger resistance (18s; 18m), called standard resistance (18s) and modified resistance (18m), respectively.

3. Generator as claimed in claim or 2, wherein a difference greater than a determined threshold between said standard resistance (18s) and said modified resistance (18m) determines a rising slope of the pulse plateau.

4. Generator as claimed in claim 2, wherein the trigger resistors (18m; 18s) are formed from agglomerated carbon bars.

5. Generator as claimed in claim 2, wherein said trigger resistors are liquid resistors formed from tubes filled with an electrolytic solution.

6. Generator as claimed in claim 2, wherein said trigger resistors are formed from a cylinder of elastomer material loaded with carbon particles.

7. Generator as claimed in claim 1, wherein the slope of the pulse plateau also depends on a difference in the parasitic input capacitances (17s; 17m) of said standard and modified switches (6s; 6m) at the moment they are closed.

8. Generator as claimed in claim 7, wherein said parasitic input capacitance (17s; 17m) of said standard and modified switches depends on the diameter of the switches used in said standard and modified modules, respectively.

9. Generator as claimed in claim 1, wherein it comprises means designed to determine a delay, called trigger delay, between the trigger signal and the formation of a pulse current between the terminals of said switches (6s; 6m) so as to adjust the slope of the pulse plateau as a function of a difference between the trigger delays of the switches of said standard (3s) and modified (3m) modules.

10. Generator as claimed in claim 3, wherein the trigger resistors (18m; 18s) are formed from agglomerated carbon bars.

11. Generator as claimed in claim 3, wherein said trigger resistors are liquid resistors formed from tubes filled with an electrolytic solution.

12. Generator as claimed in claim 3, wherein said trigger resistors are formed from a cylinder of elastomer material loaded with carbon particles.

13. Generator as claimed in claim 2, wherein the slope of the pulse plateau also depends on a difference in the parasitic input capacitances (17s; 17m) of said standard and modified switches (6s; 6m) at the moment they are closed.

14. Generator as claimed in claim 13, wherein said parasitic input capacitance (17s; 17m) of said standard and modified switches depends on the diameter of the switches used in said standard and modified modules, respectively.

15. Generator as claimed in claim 2, wherein it comprises means designed to determine a delay, called trigger delay, between the trigger signal and the formation of a pulse current between the terminals of said switches (6s; 6m) so as to adjust the slope of the pulse plateau as a function of a difference between the trigger delays of the switches of said standard (3s) and modified (3m) modules.

\* \* \* \* \*